United States Patent
Chung

(10) Patent No.: US 8,354,979 B2
(45) Date of Patent: Jan. 15, 2013

(54) LOGIC GATE, SCAN DRIVER AND ORGANIC LIGHT EMITTING DIODE DISPLAY USING THE SAME

(75) Inventor: Bo Yong Chung, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 1585 days.

(21) Appl. No.: 11/826,315

(22) Filed: Jul. 13, 2007

(65) Prior Publication Data

US 2008/0036712 A1    Feb. 14, 2008

(30) Foreign Application Priority Data

Aug. 8, 2006   (KR) .................. 10-2006-0074585

(51) Int. Cl.
*G09G 3/32* (2006.01)

(52) U.S. Cl. ............... 345/76; 345/80; 345/82; 345/98; 345/204; 326/104

(58) Field of Classification Search .............. 345/26–84, 345/87–93, 98–100, 204; 315/109.1, 169.3 315/163.9; 326/104, 119
See application file for complete search history.

(56) References Cited

U.S. PATENT DOCUMENTS

| | | | | |
|---|---|---|---|---|
| 5,311,479 A | * | 5/1994 | Harada | 365/185.16 |
| 5,598,177 A | * | 1/1997 | Mizukata et al. | 345/92 |
| 5,648,793 A | * | 7/1997 | Chen | 345/96 |
| 5,654,659 A | * | 8/1997 | Asada | 327/208 |
| 5,689,460 A | * | 11/1997 | Ooishi | 365/189.07 |
| 5,694,061 A | | 12/1997 | Morosawa et al. | |
| 5,808,483 A | * | 9/1998 | Sako | 326/113 |
| 5,883,609 A | * | 3/1999 | Asada et al. | 345/100 |
| 5,952,789 A | * | 9/1999 | Stewart et al. | 315/169.4 |
| 6,160,533 A | * | 12/2000 | Tamai et al. | 345/89 |
| 6,300,801 B1 | | 10/2001 | Jin | |
| 6,313,672 B1 | * | 11/2001 | Ajit et al. | 327/112 |
| 6,636,194 B2 | * | 10/2003 | Ishii | 345/98 |
| 6,847,340 B2 | * | 1/2005 | Wang et al. | 345/76 |
| 7,652,645 B2 | * | 1/2010 | Park et al. | 345/76 |
| 7,692,619 B2 | * | 4/2010 | Shin | 345/100 |
| 7,852,309 B2 | * | 12/2010 | Chung | 345/100 |
| 8,035,581 B2 | * | 10/2011 | Choi | 345/76 |
| 2003/0178947 A1 | * | 9/2003 | Shin et al. | 315/169.3 |
| 2004/0164978 A1 | * | 8/2004 | Shin et al. | 345/211 |
| 2006/0114210 A1 | * | 6/2006 | Chen et al. | 345/98 |
| 2007/0040786 A1 | * | 2/2007 | Chung | 345/92 |

(Continued)

FOREIGN PATENT DOCUMENTS

JP           05-048465        2/1993

(Continued)

*Primary Examiner* — Joe H Cheng
(74) *Attorney, Agent, or Firm* — Lee & Morse, P.C.

(57) ABSTRACT

An organic light emitting diode display, including pixel circuits coupled to respective data lines and scan lines, a data driver configured to supply data signals to the data lines, and a scan driver configured to provide scan signals to the scan lines, wherein the scan driver includes at least one decoder including a plurality of NOR gates, the decoder configured to provide a first plurality of signals, and a plurality of NAND gates coupled to respective scan lines, the NAND gates being configured to perform a NAND operation on the first plurality of signals and to provide scan signals to the scan lines, wherein all transistors in each of the NOR gates and each of the NAND gates are a same type of MOS transistor.

24 Claims, 7 Drawing Sheets

U.S. PATENT DOCUMENTS

2008/0036697 A1* 2/2008 Chung .......................... 345/55

FOREIGN PATENT DOCUMENTS

| | | |
|---|---|---|
| JP | 05-095276 | 4/1993 |
| JP | 05-300007 | 11/1993 |
| JP | 08-032441 | 11/2001 |
| KR | 10-1991-0021050 | 12/1991 |
| KR | 10-1997-0008886 | 2/1997 |
| KR | 10-2000-0021373 | 4/2000 |
| KR | 10-0314732 B1 | 11/2001 |

* cited by examiner

LOGIC GATE, SCAN DRIVER AND ORGANIC LIGHT EMITTING DIODE DISPLAY USING THE SAME

CROSS-REFERENCE TO RELATED APPLICATION

This application is related to U.S. patent application Ser. No. 11/826,321, entitled "LOGIC GATE, SCAN DRIVER AND ORGANIC LIGHT EMITTING DIODE DISPLAY USING THE SAME," which was filed on Jul. 13, 2007, and which issued as U.S. Pat. No. 7,528,631 on May 9, 2009.

BACKGROUND OF THE INVENTION

1. Field of the Invention

Embodiments of the present invention relate to a logic gate, a scan driver and an organic light emitting diode display using the same. More particularly, embodiments of the present invention relate to a logic gate that may be realized using PMOS transistors, and a scan driver and an organic light emitting diode (OLED) display using the same.

2. Description of the Related Art

Recently, various flat panel displays exhibiting reduced weight and volume, which are disadvantages of cathode ray tubes (CRTs), have been developed. Flat panel displays include, e.g., liquid crystal displays (LCDs), field emission displays (FEDs), plasma display panels (PDPs), and OLED displays.

The OLED display makes use of organic light emitting diodes that emit light by re-combination of electrons and holes. The OLED display has advantages of high response speed and low power consumption.

The OLED display may include pixels, a data driver and a scan driver. The pixels may be arranged in a matrix. The data driver may drive data lines that are coupled to the pixels, and the scan driver may drive scan lines that are also coupled to the pixels.

The data driver may provide a data signal corresponding to data every horizontal time period, thereby causing the pixels to display a predetermined image. The scan driver may provide a scan signal every horizontal time period to select pixels to which the data signal is provided.

As a size of OLED display is increased, it may be desirable to form the scan driver on the OLED panel in order to reduce the size, weight and manufacturing cost thereof. However, because a conventional scan driver includes PMOS transistors and NMOS transistors, it is difficult to form such a scan driver on the panel. Accordingly, there is a demand for a scan driver that is formed of a single type of MOS transistor.

SUMMARY OF THE INVENTION

The present invention is therefore directed to a logic gate, a scan driver and an organic light emitting diode display using the same, which substantially overcome one or more of the problems due to the limitations and disadvantages of the related art.

It is therefore a feature of an embodiment of the present invention to provide a logic gate suitable for incorporation into a display panel and including one type of transistor.

It is therefore another feature of an embodiment of the present invention to provide a scan driver having logic gates that include one type of transistor.

It is therefore a further feature of an embodiment of the present invention to provide a display that includes pixel circuits and scan driver logic gates that are part of a same panel.

At least one of the above and other features and advantages of the present invention may be realized by providing an organic light emitting diode display, including pixel circuits coupled to respective data lines and scan lines, a data driver configured to supply data signals to the data lines, and a scan driver configured to provide scan signals to the scan lines, wherein the scan driver includes at least one decoder including a plurality of NOR gates, the decoder configured to provide a first plurality of signals, and a plurality of NAND gates coupled to respective scan lines, the NAND gates being configured to perform a NAND operation on the first plurality of signals and to provide scan signals to the scan lines, wherein all transistors in each of the NOR gates and each of the NAND gates are a same type of MOS transistor.

The pixel circuits may each include at least one transistor, and the NAND gates and the pixel circuits may be part of a same panel. Transistors in each of the pixel circuits and each of the NAND gates may be PMOS transistors. The NOR gates and the data driver may be part of a same chip. The at least one decoder may include a plurality of input terminals configured to receive input signals from the outside, and a plurality of inverters may be coupled respectively to the input terminals to reverse the input signals. The at least one decoder may include a plurality of input terminals configured to receive input signals and input bar signals from the outside, and the input signals and the input bar signals may be set to a longer period of a HIGH polarity than that of a LOW polarity.

Each of the NAND gates may include a first control transistor configured to control a connection between a second power source and a first output terminal, a first electrode of the first control transistor being coupled to the first output terminal, a first plurality of transistors coupled in parallel between the first electrode of the first control transistor and a first power source, the first plurality of transistors being configured to operate in correspondence with the first plurality of signals, a second plurality of transistors coupled in parallel between the first electrode of the first control transistor and a gate electrode of the first control transistor, the second plurality of transistors being configured to operate in correspondence with the first plurality of signals, and a third plurality of transistors coupled in series between the second power source and the gate electrode of the first control transistor, the third plurality of transistors being configured to operate in correspondence with a first plurality of bar signals.

Each of the NOR gates may include a second control transistor configured to control a connection between a fourth power source and a second output terminal, a first electrode of the second control transistor being coupled to the second output terminal, a fourth plurality of transistors coupled in series between the first electrode of the second control transistor and a third power source, the fourth plurality of transistors being configured to operate in correspondence with a plurality of input signals, a fifth plurality of transistors coupled in series between the first electrode of the second control transistor and a gate electrode of the second control transistor, the fifth plurality of transistors being configured to operate in correspondence with the plurality of input signals, and a sixth plurality of transistors coupled in parallel between the gate electrode of the second control transistor and the fourth power source, the sixth plurality of transistors being configured to operate in correspondence with a plurality of input bar signals.

The first and third power sources may provide a same first voltage, and the second and fourth power sources may provide a same second voltage that is lower than the first voltage.

Each of the NOR gates may include a control transistor configured to control a connection between a second power source and an output terminal, a first electrode of the control transistor being coupled to the output terminal, a first plurality of transistors coupled in series between the first electrode of the control transistor and a first power source, the first plurality of transistors being configured to operate in correspondence with a plurality of input signals, a second plurality of transistors coupled in series between the first electrode of the control transistor and a gate electrode of the control transistor, the second plurality of transistors being configured to operate in correspondence with the plurality of input signals, and a third plurality of transistors coupled in parallel between the gate electrode of the control transistor and the second power source, the third plurality of transistors being configured to operate in correspondence with a plurality of input bar signals.

The display may include a plurality of decoders, the display may be configured to provide a plurality of input signals to the decoders, the input signals having different frequencies, and a decoder receiving a higher frequency input signal may be disposed closer to the NAND gates than a decoder receiving a lower frequency input signal.

At least one of the above and other features and advantages of the present invention may also be realized by providing a scan driver, including at least one decoder including a plurality of NOR gates, the decoder configured to provide a first plurality of signals, and a plurality of NAND gates configured to perform a NAND operation on the first plurality of signals and to provide scan signals, wherein all transistors in each of the NOR gates and each of the NAND gates are a same type of MOS transistor. Transistors in each of the NOR gates and each of the NAND gates may be PMOS transistors. The at least one decoder may include a plurality of input terminals configured to receive input signals from the outside, and a plurality of inverters may be coupled respectively to the input terminals to reverse the input signals. The at least one decoder may include a plurality of input terminals configured to receive input signals and input bar signals from the outside, the input signals and the input bar signals being set to a longer period of a HIGH polarity than that of a LOW polarity. Each of the NAND gates may include a first control transistor configured to control a connection between a second power source and a first output terminal, a first electrode of the first control transistor being coupled to the first output terminal, a first plurality of transistors coupled in parallel between the first electrode of the first control transistor and a first power source, the first plurality of transistors being configured to operate in correspondence with the first plurality of signals, a second plurality of transistors coupled in parallel between the first electrode of the first control transistor and a gate electrode of the first control transistor, the second plurality of transistors being configured to operate in correspondence with the first plurality of signals, and a third plurality of transistors coupled in series between the second power source and the gate electrode of the first control transistor, the third plurality of transistors being configured to operate in correspondence with a first plurality of bar signals. The scan driver may further include a capacitor coupled between the first electrode and the gate electrode of the first control transistor.

Each of the NOR gates may include a second control transistor configured to control a connection between a fourth power source and a second output terminal, a first electrode of the second control transistor being coupled to the second output terminal, a fourth plurality of transistors coupled in series between the first electrode of the second control transistor and a third power source, the fourth plurality of transistors being configured to operate in correspondence with a plurality of input signals, a fifth plurality of transistors coupled in series between the first electrode of the second control transistor and a gate electrode of the second control transistor, the fifth plurality of transistors being configured to operate in correspondence with the plurality of input signals, and a sixth plurality of transistors coupled in parallel between the gate electrode of the second control transistor and the fourth power source, the sixth plurality of transistors being configured to operate in correspondence with a plurality of input bar signals. The scan driver may further include a second capacitor coupled between the first electrode and the gate electrode of the second control transistor.

Each of the NOR gates may include a control transistor configured to control a connection between a second power source and an output terminal, a first electrode of the control transistor being coupled to the output terminal, a first plurality of transistors coupled in series between the first electrode of the control transistor and a first power source, the first plurality of transistors being configured to operate in correspondence with a plurality of input signals, a second plurality of transistors coupled in series between the first electrode of the control transistor and a gate electrode of the control transistor, the second plurality of transistors being configured to operate in correspondence with the plurality of input signals, and a third plurality of transistors coupled in parallel between the gate electrode of the control transistor and the second power source, the third plurality of transistors being configured to operate in correspondence with a plurality of input bar signals.

At least one of the above and other features and advantages of the present invention may further be realized by providing a NAND gate, including a control transistor configured to control a connection between a second power source and an output terminal, a first electrode of the control transistor being coupled to the output terminal, a first plurality of transistors coupled in parallel between the first electrode of the control transistor and a first power source, the first plurality of transistors being configured to operate in correspondence with a plurality of signals, a second plurality of transistors coupled in parallel between the first electrode of the control transistor and a gate electrode of the control transistor, the second plurality of transistors being configured to operate in correspondence with the plurality of signals, and a third plurality of transistors coupled in series between the second power source and the gate electrode of the control transistor, the third plurality of transistors being configured to operate in correspondence with a plurality of bar signals.

The NAND gate may further include a capacitor coupled between the first electrode and the gate electrode of the control transistor.

At least one of the above and other features and advantages of the present invention may further be realized by providing a NOR gate, including a control transistor configured to control a connection between a second power source and an output terminal, a first electrode of the control transistor being coupled to the output terminal, a first plurality of transistors coupled in series between the first electrode of the control transistor and a first power source, the first plurality of transistors being configured to operate in correspondence with a plurality of input signals, a second plurality of transistors coupled in series between the first electrode of the control transistor and a gate electrode of the control transistor, the second plurality of transistors being configured to operate in correspondence with the plurality of input signals, and a third plurality of transistors coupled in parallel between the gate electrode of the control transistor and the second power source, the third plurality of transistors being configured to operate in correspondence with a plurality of input bar signals.

The NOR gate may further include a capacitor coupled between the first electrode and the gate electrode of the control transistor.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
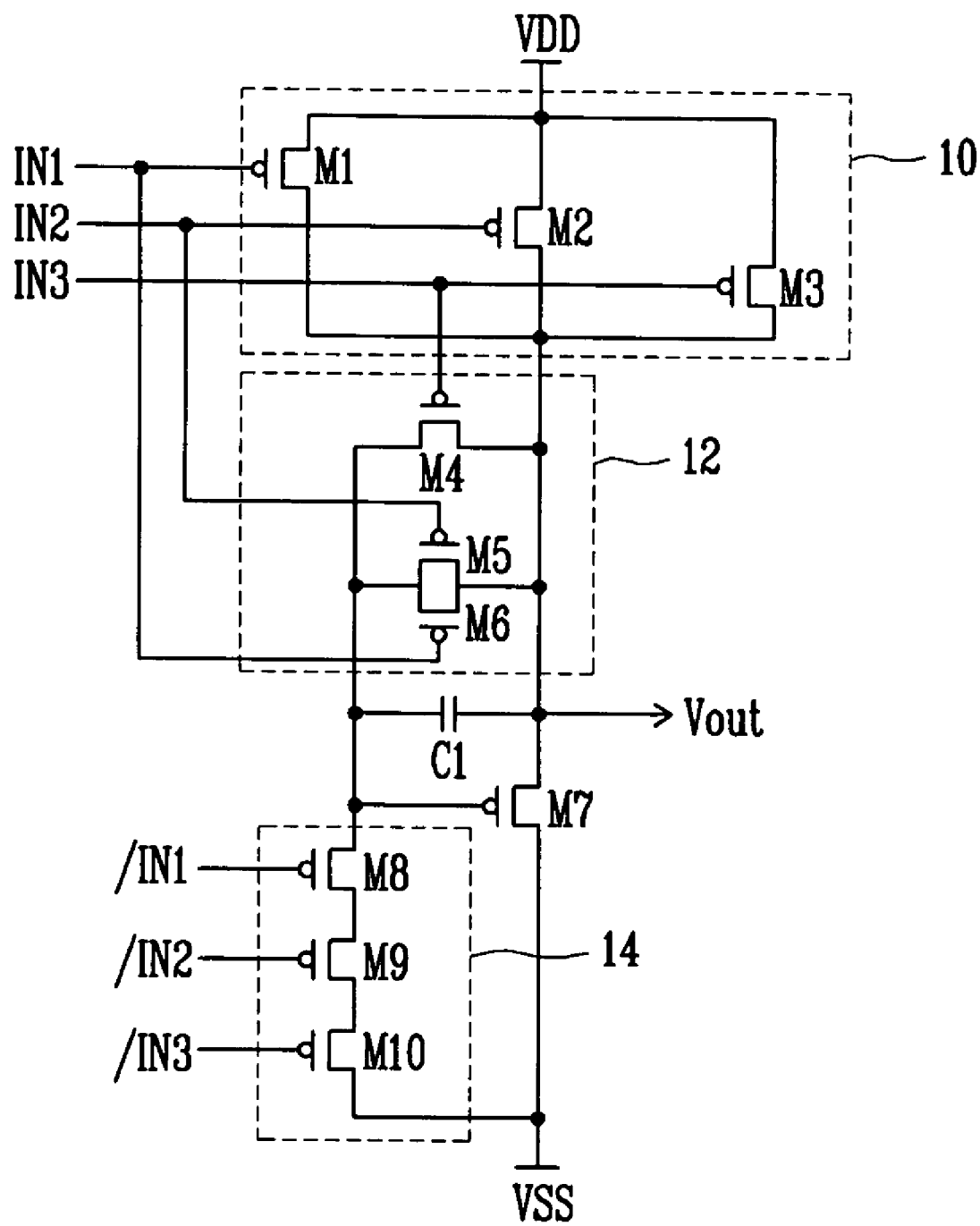
FIG. 1 illustrates a circuit view of a NAND gate according to an embodiment of the present invention.

Korean Patent Application No. 10-2006-0074585, filed on Aug. 8, 2006, in the Korean Intellectual Property Office, and entitled: "Logic Gate, Scan Driver and Organic Light Emitting Diode Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

Where an element is described as being coupled to a second element, the element may be directly coupled to second element, or may be indirectly coupled to second element via one or more other elements. Further, where an element is described as being coupled to a second element, it will be understood that the elements may be electrically coupled, e.g., in the case of transistors, capacitors, power supplies, nodes, etc. In the drawings, elements may be omitted for clarity. Like reference numerals refer to like elements throughout.

Embodiments of the present invention will now be described wherein transistors in particular circuits are all PMOS transistors. For these circuits, as used herein, the polarity of the first power source (VDD) is a HIGH polarity, and the polarity of a second power source (VSS) is a LOW polarity, i.e., a voltage of the second power source (VSS) is lower than a voltage of the first power source (VDD).

FIG. 1 illustrates a circuit view of a NAND gate according to an embodiment of the present invention. In this embodiment of the present invention, the NAND gate may be realized using a same type of MOS transistor, e.g., all PMOS transistors.

Referring to FIG. 1, the NAND gate may include a seventh transistor (M7) (control transistor), for controlling a voltage supplied to an output terminal (Vout); a first driver 10 coupled between a first power source (VDD) and the seventh transistor (M7), which may control the connection of a first electrode of the seventh transistor (M7) to the first power source (VDD) in correspondence with polarities (HIGH or LOW) of a first input signal (IN1), a second input signal (IN2), and a third input signal (IN3); a second driver 12 coupled between the first electrode and a gate electrode of the seventh transistor (M7), which may control the connection of the gate electrode to the first electrode of the seventh transistor (M7) in correspondence with polarities (HIGH or LOW) of the first input signal (IN1), the second input signal (IN2), and the third input signal (IN3); and a third driver 14 coupled between the gate electrode of the seventh transistor (M7) and a second power source (VSS), which may control a connection between the gate electrode of the seventh transistor (M7) and the second power source (VSS) in correspondence with polarities (HIGH or LOW) of a first input bar signal (/IN1), a second input bar signal (/IN2) and a third input bar signal (/IN3).

The seventh transistor (M7) may be turned on or turned off in correspondence with a voltage supplied to its gate electrode. For example, the seventh transistor (M7) may be turned off when a voltage of the first power source (VDD) is supplied to its gate electrode and may be turned on when a voltage of the second power source (VSS) is supplied to its gate electrode. The first power source (VDD) may be set to a voltage of a positive polarity, and the voltage of the second power source (VSS) may be set to a lower voltage, e.g., a ground voltage or a voltage of a negative polarity.

The first driver 10 may include a first transistor (M1), a second transistor (M2) and a third transistor (M3), which may be coupled in parallel between the first power source (VDD) and the first electrode of the seventh transistor (M7). The first driver 10 may electrically couple the first electrode of the seventh transistor (M7) to the first power source (VDD) when any one of the first input signal (IN1), the second input signal (IN2) and the third input signal (IN3) has a LOW polarity.

More specifically, the first transistor (M1) may be coupled between the first power source (VDD) and the first electrode of the seventh transistor (M7), and may be turned on or turned off by the first input signal (IN1). Thus, the first transistor (M1) may be turned on when the first input signal (IN1) has a LOW polarity and may be turned off otherwise.

The second transistor (M2) may be coupled between the first power source (VDD) and the first electrode of the seventh transistor (M7), and may be turned on or turned off by the second input signal (IN2). Thus, the second transistor (M2) may be turned on when the second input signal (IN2) has a LOW polarity and may be turned off otherwise.

The third transistor (M3) may be coupled between the first power source (VDD) and the first electrode of the seventh transistor (M7), and may be turned on or turned off by the third input signal (IN3). Thus, the third transistor (M3) may be turned on when the third input signal (IN3) has a LOW polarity and may be turned off otherwise.

The second driver 12 may include a fourth transistor (M4), a fifth transistor (M5) and a sixth transistor (M6), which may be coupled in parallel between the first electrode of the seventh transistor (M7) and the gate electrode of the seventh transistor (M7). The second driver 12 may electrically couple the gate electrode of the seventh transistor (M7) to the first electrode of the seventh transistor (M7) when any one of the first input signal (IN1), the second input signal (IN2) and the third input signal (IN3) has a LOW polarity.

More specifically, the fourth transistor (M4) may be coupled between the first electrode and the gate electrode of the seventh transistor (M7), and may be turned on or turned off by the third input signal (IN3). Thus, the fourth transistor (M4) may be turned on when the third input signal (IN3) has a LOW polarity and may be turned off otherwise.

The fifth transistor (M5) may be coupled between the first electrode and the gate electrode of the seventh transistor (M7), and may be turned on or turned off by the second input signal (IN2). Thus, the fifth transistor (M5) may be turned on when the second input signal (IN2) has a LOW polarity and may be turned off otherwise.

The sixth transistor (M6) may be coupled between the first electrode and the gate electrode of the seventh transistor (M7), and may be turned on or turned off by the first input signal (IN1). Thus, the sixth transistor (M6) may be turned on when the first input signal (IN1) has a LOW polarity and may be turned off otherwise.

The third driver 14 may include an eighth transistor (M8), a ninth transistor (M9) and a tenth transistor (M10), which may be coupled in series between the gate electrode of the seventh transistor (M7) and the second power source (VSS). The third driver 14 may electrically couple the second power source (VSS) to the gate electrode of the seventh transistor (M7) when a first input bar signal (/IN1), a second input bar signal (/IN2) and a third input bar signal (/IN3) all have a LOW polarity.

More specifically, the eighth transistor (M8), the ninth transistor (M9) and the tenth transistor (M10) may be coupled in series between the gate electrode of the seventh transistor (M7) and the second power source (VSS). The eighth transistor (M8) may be turned on when the first input bar signal (/IN1) has a LOW polarity, the ninth transistor (M9) may be turned on when the input bar signal (/IN2) has a LOW polarity and the tenth transistor (M1) may be turned on when the third input bar signal (/IN3) has a LOW polarity.

Table 1 represents a Truth Table of a NAND gate according to an embodiment of the present invention.

TABLE 1

| IN1 | IN2 | IN3 | Vout |
|---|---|---|---|
| 0 | 0 | 0 | 1 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

An operation of the NAND gate will now be described in detail, with reference to FIG. 1 and Table 1. Any one of the first transistor (M1), the second transistor (M2) and the third transistor (M3) may be turned on when a respective one of the first input signal (IN1), the second input signal (IN2) and the third input signal (IN3) has a LOW polarity, in which case the first power source (VDD) and the first electrode of the seventh transistor (M7) may be electrically coupled to each other, and a voltage of the first power source (VDD) may thus be output to the output terminal (Vout). Thus, a voltage having a HIGH polarity may be supplied to the output terminal (Vout) when any one of the first input signal (IN1), the second input signal (IN2) and the third input signal (IN3) has a LOW polarity.

Any one of the fourth transistor (M4), the fifth transistor (M5) and the sixth transistor (M6) may be turned on when a respective one of the first input signal (IN1), the second input signal (IN2) and the third input signal (IN3) has a LOW polarity, in which case the first power source (VDD) and the gate electrode of the seventh transistor (M7) may be electrically coupled to each other. In this case, voltages of both terminals of a first capacitor (C1), which may be coupled between the gate electrode and the first electrode of the seventh transistor (M7), may be set to the same voltage value, i.e., the voltage of the first power source (VDD). The first capacitor (C1) may reduce or prevent a leakage current from flowing from the seventh transistor (M7) to the second power source (VSS) by maintaining a constant voltage between the gate electrode and the first electrode of the seventh transistor (M7).

In an embodiment of the present invention, when any one of the first input signal (IN1), the second input signal (IN2) and the third input signal (IN3) has a LOW polarity, respective ones of the first input bar signal (/IN1), the second input bar signal (/IN2) and the third input bar signal (/IN3) may have a HIGH polarity, in which case, when any one of the eighth transistor (M8), the ninth transistor (M9) and the tenth transistor (M10) is resultantly turned off, the electrical connection between the gate electrode of the seventh transistor (M7) and the second power source (VSS) may be interrupted.

The first transistor (M1), the second transistor (M2) and the third transistor (M3) may all be turned off when all of the first input signal (IN1), the second input signal (IN2) and the third input signal (IN3) have a HIGH polarity, in which case the electrical connection between the first power source (VDD) and the first electrode of the seventh transistor (M7) may be interrupted.

The fourth transistor (M4), the fifth transistor (M5) and the sixth transistor (M6) may all be turned off when all of the first input signal (IN1), the second input signal (IN2) and the third input signal (IN3) have a HIGH polarity, in which case the electrical connection between the first electrode and the gate electrode of the seventh transistor (M7) may be electrically interrupted.

In an embodiment of the present invention, the first input bar signal (/IN1), the second input bar signal (/IN2) and the third input bar signal (/IN3) may all have a LOW polarity when respective ones of the first input signal (IN1), the second input signal (IN2) and the third input signal (IN3) all have a HIGH polarity. In this case, the eighth transistor (M8), the ninth transistor (M9) and the tenth transistor (M10) may all be turned on, and a voltage of the second power source (VSS) may be supplied to the gate electrode of the seventh transistor (M7). When the voltage of the second power source (VSS) is supplied to the gate electrode of the seventh transistor (M7), the seventh transistor (M7) may be turned on and a voltage of the second power source (VSS) may be supplied to the output terminal (Vout). Thus, a voltage of the second power source (VSS) corresponding to the LOW polarity may be output into the output terminal (Vout) when all of the first input signal (IN1), the second input signal (IN2) and the third input signal (IN3) have a HIGH polarity.

As described above, a NAND gate according to this embodiment of the present invention may include transistors that are all a same type of MOS transistor, e.g., all PMOS transistors. Accordingly, the NAND gate may be suitable for forming on a panel of an organic light emitting diode display having pixel circuits that include the same type of transistors, e.g., PMOS transistors. Therefore the manufacturing cost of such a panel may be lowered and the manufacturing process may be simplified.

It will be appreciated that, although the NAND gate illustrated in FIG. 1 has three inputs, embodiments of the present invention are not limited thereto. The number of the inputs may be varied by varying the number of transistors included in each of the first driver 10, the second driver 12 and the third driver 14. For example, four transistors may be included in each of the first driver 10, the second driver 12 and the third driver 14, so as to provide a NAND gate having four inputs.

Figure 2:
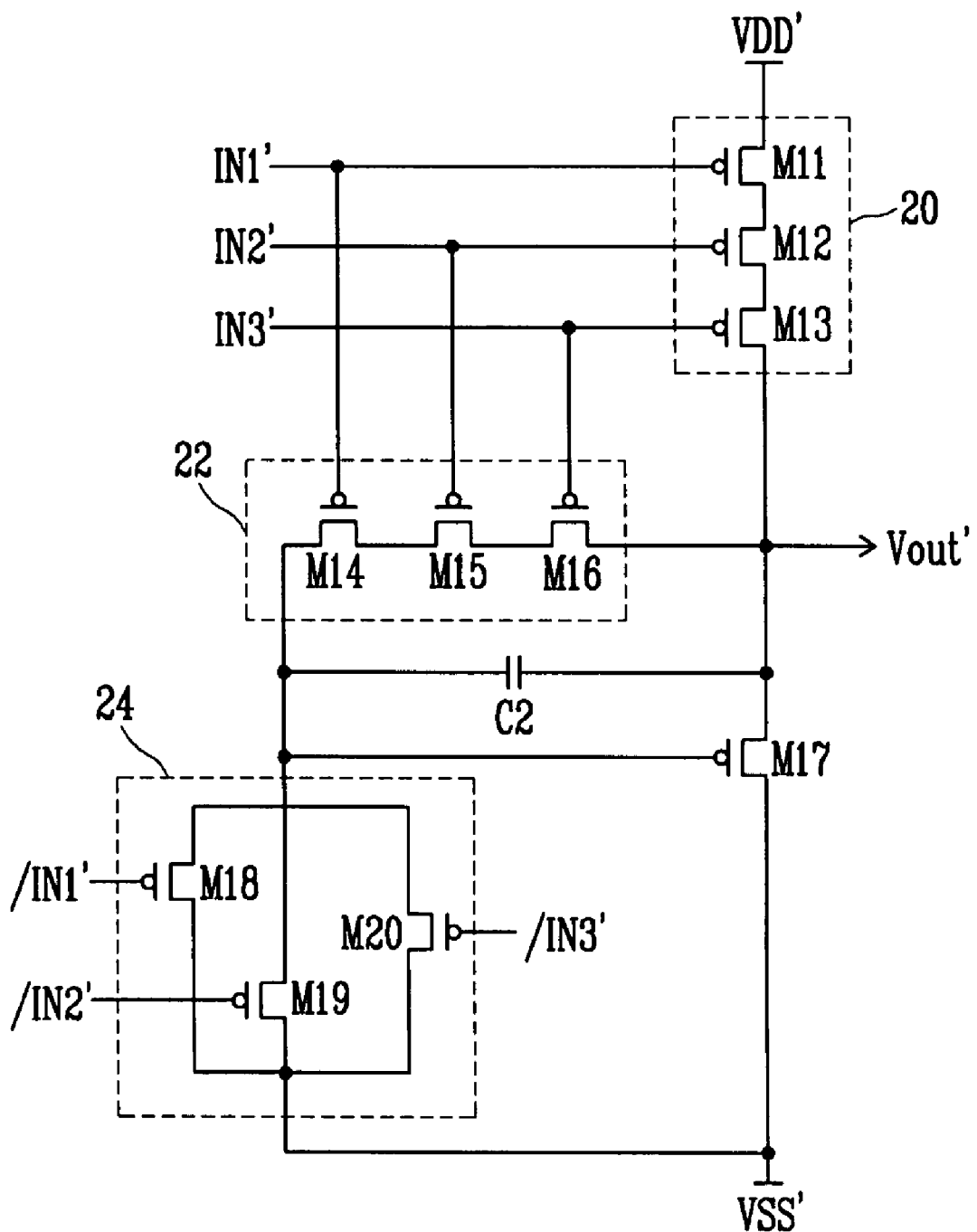
FIG. 2 illustrates a circuit view of a NOR gate according to an embodiment of the present invention.

FIG. 2 illustrates a circuit view of a NOR gate according to an embodiment of the present invention. The NOR gate according to this embodiment of the present invention may be realized using a same type of MOS transistor, e.g., all PMOS transistors.

Referring to FIG. 2, the NOR gate may include a seventeenth transistor (M17) (a control transistor) for controlling a voltage supplied to an output terminal (Vout'); a fourth driver 20 coupled between a first power source (VDD') and the seventeenth transistor (M17) and controlling the connection of a first electrode of the seventeenth transistor (M17) to the first power source (VDD') in correspondence with polarities (HIGH or LOW) of a first input signal (IN1'), a second input signal (IN2') and a third input signal (IN3'); a fifth driver 22 coupled between the first electrode and a gate electrode of the seventeenth transistor (M17), and controlling the connection of the gate electrode to the first electrode of the seventeenth transistor (M17) in correspondence with polarities (HIGH or LOW) of the first input signal (IN1'), the second input signal (IN2') and the third input signal (IN3'); and a sixth driver 24 coupled between the gate electrode of the seventeenth transistor (M17) and the second power source (VSS), and controlling a connection between the gate electrode of the seventeenth transistor (M17) and a second power source (VSS') in correspondence with polarities (HIGH or LOW) of a first input bar signal (/IN1'), a second input bar signal (/IN2') and a third input bar signal (/IN3'). Signals output from the output terminals (Vout') of the NOR gates may be supplied as the first, second and third input signals IN1, IN2 and IN3 of the NAND gates described above.

The seventeenth transistor (M17) may be turned on or turned off in correspondence with a voltage supplied to a gate electrode of the seventeenth transistor (M17). Thus, the seventeenth transistor (M17) may be turned off when a voltage of the first power source (VDD') is supplied to its gate electrode and may be turned on when a voltage of the second power source (VSS') is supplied to its gate electrode.

The fourth driver 20 may include an eleventh transistor (M11), a twelfth transistor (M12) and a thirteenth transistor (M13), which may all be coupled in series between the first power source (VDD') and the first electrode of the seventeenth transistor (M17). The fourth driver 20 may electrically couple the first electrode of the seventeenth transistor (M17) to the first power source (VDD') when all of the first input signal (IN1), the second input signal (IN2) and the third input signal (IN3) have a LOW polarity.

More specifically, the eleventh transistor (M11), the twelfth transistor (M12) and the thirteenth transistor (M13) may be coupled in series between the first electrode of the seventeenth transistor (M17) and the first power source (VDD'). The eleventh transistor (M11) may be turned on when the first input signal (IN1') has a LOW polarity, the twelfth transistor (M12') may be turned on when the second input signal (IN2) has a LOW polarity and the thirteenth transistor (M13) may be turned on when the third input signal (IN3') has a LOW polarity.

The fifth driver 22 may include a fourteenth transistor (M14), a fifteenth transistor (M15) and a sixteenth transistor (M16), which may all be coupled in series between the first electrode and the gate electrode of the seventeenth transistor (M17). The fifth driver 22 may electrically couple the gate electrode to the first electrode of the seventeenth transistor (M17) when all of the first input signal (IN1'), the second input signal (IN2') and the third input signal (IN3') have a LOW polarity.

More specifically, the fourteenth transistor (M14), the fifteenth transistor (M15) and the sixteenth transistor (M16) may be coupled in series between the first electrode and the gate electrode of the seventeenth transistor (M17). The fourteenth transistor (M14) may be turned on when the first input signal (IN1') has a LOW polarity, the fifteenth transistor (M15) may be turned on when the second input signal (IN2') has a LOW polarity and the sixteenth transistor (M16) may be turned on when the third input signal (IN3') has a LOW polarity.

The sixth driver 24 may include the eighteenth transistor (M18), the nineteenth transistor (M19) and the twentieth transistor (M20), which may all be coupled in parallel between the gate electrode of the seventeenth transistor (M17) and the second power source (VSS'). The sixth driver 24 may electrically couple the second power source (VSS') to the gate electrode of the seventeenth transistor (M17) when any of the first input bar signal (/IN1'), the second input bar signal (/IN2') and the third input bar signal (/IN3') has a LOW polarity.

More specifically, the eighteenth transistor (M18) may be coupled between the gate electrode of the seventeenth transistor (M17) and the second power source (VSS'), and may be turned on or turned off by the first input bar signal (/IN1'). Thus, the eighteenth transistor (M18) may be turned on when the first input bar signal (/IN1) has a LOW polarity, and turned off otherwise.

The nineteenth transistor (M19) may be coupled between the gate electrode of the seventeenth transistor (M17) and the second power source (VSS'), and may be turned on or turned off by the second input bar signal (/IN2'). Thus, the nineteenth transistor (M19) may be turned on when the second input bar signal (/IN2') has a LOW polarity, and turned off otherwise.

The twentieth transistor (M20) may be coupled between the gate electrode of the seventeenth transistor (M17) and the second power source (VSS'), and may be turned on or turned off by the third input bar signal (/IN3'). Thus, the twentieth transistor (M20) may be turned on when the third input bar signal (/IN3) has a LOW polarity, and turned off otherwise.

Table 2 represents a Truth Table of a NOR gate according to an embodiment of the present invention.

TABLE 2

| IN1' | IN2' | IN3' | Vout' |
|------|------|------|-------|
| 0 | 0 | 0 | 1 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

An operation of the NOR gate will now be described in detail, with reference to FIG. 2 and Table 2. Any one of the eleventh transistor (M11), the twelfth transistor (M12) and the thirteenth transistor (M13) may be turned off when a respective one of the first input signal (IN1'), the second input signal (IN2') and the third input signal (IN3') has a HIGH polarity. The first power source (VDD') and the first electrode of the seventeenth transistor (M17) may be electrically decoupled when any of the eleventh transistor (M11), the twelfth transistor (M12) and the thirteenth transistor (M13) is turned off.

Any one of the fourteenth transistor (M14), the fifteenth transistor (M15) and the sixteenth transistor (M16) may be turned off when a respective one of the first input signal (IN1'), the second input signal (IN2') and the third input signal (IN3') has a HIGH polarity. When any one of the fourteenth transistor (M14), the fifteenth transistor (M15) and the sixteenth transistor (M16) is turned off, the first electrode and the gate electrode of the seventeenth transistor (M17) may be electrically decoupled.

In an embodiment of the present invention, the first input bar signal (/IN1'), the second input bar signal (/IN2') and the third input bar signal (/IN3') may have a LOW polarity when respective ones of the first input signal (IN1'), the second input signal (IN2') and the third input signal (IN3') has a HIGH polarity. Any of the eighteenth transistor (M18), the nineteenth transistor (M19) and the twentieth transistor (M20) may be turned on by a signal having a LOW polarity, in which case a voltage of the second power source (VSS') may be supplied to the gate electrode of the seventeenth transistor (M17), such that the seventeenth transistor (M17) may be turned on and a voltage of the second power source (VSS'), i.e., a signal having a LOW polarity, may be output to the output terminal (Vout').

The eleventh transistor (M11), the twelfth transistor (M12) and the thirteenth transistor (M13) may all be turned on when all of the first input signal (IN1'), the second input signal (IN2') and the third input signal (IN3') have a LOW polarity.

When the eleventh transistor (M11), the twelfth transistor (M12) and the thirteenth transistor (M13) are all turned on, the first power source (VDD') and the first electrode of the seventeenth transistor (M17) may be electrically coupled to each other, such that a voltage of the first power source (VDD'), i.e., a HIGH polarity signal, may be output to the output terminal (Vout').

The fourteenth transistor (M14), the fifteenth transistor (M15) and the sixteenth transistor (M16) may be turned on when the respective first input signal (IN1'), second input signal (IN2') and the third input signal (IN3') have a LOW polarity. When the fourteenth transistor (M14), the fifteenth transistor (M15) and the sixteenth transistor (M16) are all turned on, the first electrode and the gate electrode of the seventeenth transistor (M17) may be electrically coupled to each other. Therefore, the seventeenth transistor (M17) may be turned off by the voltage of the first power source (VDD') being supplied to the gate electrode of the seventeenth transistor (M17), and a voltage of the first power source (VDD') may be output to the output terminal (Vout') and maintained stably. A second capacitor (C2) may be coupled between the first electrode and the gate electrode of the seventeenth transistor (M17), which may reduce or prevent a leakage current from flowing by maintaining a constant voltage between the gate electrode and the first electrode of the seventeenth transistor (M17).

In an embodiment of the present invention, the first input bar signal (/IN1'), the second input bar signal (/IN2') and the third input bar signal (/IN3') may have a HIGH polarity when respective ones of the first input signal (/IN1'), the second input signal (IN2') and the third input signal (IN3') have a LOW polarity. The gate electrode of the seventeenth transistor (M17) and the second power source (VSS') may be electrically isolated from each other when all of the eighteenth transistor (M18), the nineteenth transistor (M19) and the twentieth transistor (M20) are turned off.

As described above, a NOR gate according to this embodiment of the present invention may include transistors that are all one type of MOS transistor, e.g., all PMOS transistors. Accordingly, the NOR gate may be suitable for forming in a panel of an organic light emitting diode display that includes pixel circuits having PMOS transistors. Therefore, the manufacturing cost may be lowered and the manufacturing process may be simplified.

It will be appreciated that, although the NOR gate illustrated in FIG. 2 has three inputs, embodiments of the present invention are not limited thereto. The number of the inputs may be varied by varying the number of transistors included in each of the fourth driver 20, the fifth driver 22 and the sixth driver 24. For example, four transistors may be included in each of the fourth driver 20, the fifth driver 22 and the sixth driver 24, so as to provide a NOR gate having four inputs.

Figure 3:
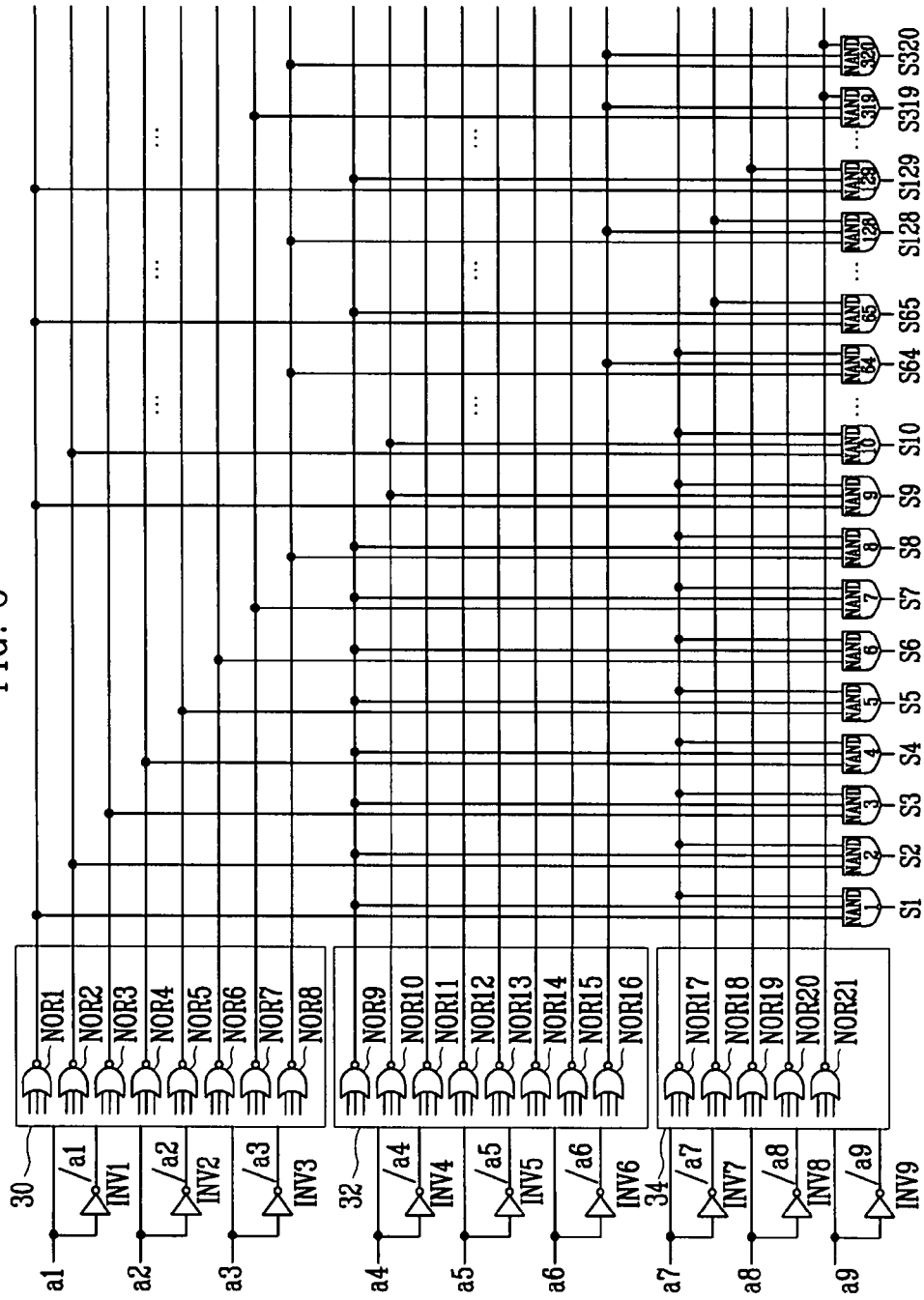
FIG. 3 illustrates a schematic view of a scan driver according to an embodiment of the present invention, which includes the logic gates shown in FIGS. 1 and 2.

FIG. 3 illustrates a schematic view of a scan driver according to an embodiment of the present invention, which includes the logic gates shown in FIGS. 1 and 2, i.e., the NAND gate and the NOR gate as shown in FIGS. 1 and 2, respectively. For convenience of description, a scan driver coupled to 320 scan lines (S1 to S320) will be described. Scan signals may be sequentially supplied to the scan lines (S1 to S320).

Referring to FIG. 3, the scan driver of the present invention may include multiple decoders, e.g., decoders 30, 32, 34. The scan driver may further include NAND gates (NAND1 to NAND320) for generating scan signals by performing a NAND operation on outputs of the decoders 30, 32, 34.

The first decoder 30 and the second decoder 32 may each include three input terminals and eight output terminals, and the third decoder 34 may include three input terminals and five output terminals. The first decoder 30 and the second decoder 32 may each include eight NOR gates, and the third decoder 34 may include five NOR gates, which multiply to yield a total of 320 scan lines (8×8×5). Thus, in this example, 8×8×5 NOR gates are included in the scan driver to supply a scan signal to the 320 scan lines (S1 to S320), as shown in FIG. 3. It will be appreciated, however, that the number of NOR gates and the number of decoders may be determined depending on the number of the scan lines coupled to the scan driver.

As illustrated in FIG. 3, the first decoder 30 may include eight NOR gates (NOR1 to NOR8). The first decoder 30 may supply input signals INn' and input bar /INn' signals to the NOR gates (NOR1 to NOR8). In an embodiment of the present invention, the input signals INn' may be supplied from a first input terminal (a1), a second input terminal (a2) and a third input terminal (a3), and the input bar signals /INn' may be supplied from a first inverter (INV1) coupled to the first input terminal (a1), a second inverter (INV2) coupled to the second input terminal (a2) and a third inverter (INV3) coupled to the third input terminal (a3). Additional details of the input signals INn' and the input bar signals /INn' supplied to the NOR gates (NOR1 to NOR8) will be described below.

The second decoder 32 may include eight NOR gates (NOR9 to NOR16). The second decoder 32 may supply input signals INn' and input bar signals /INn' to the NOR gates (NOR9 to NOR16). In an embodiment of the present invention the input signals INn' may be supplied from a fourth input terminal (a4), a fifth input terminal (a5) and a sixth input terminal (a6), and the input bar signals /INn' may be supplied from a fourth inverter (INV4) coupled to the fourth input terminal (a4), a fifth inverter (INV5) coupled to the fifth input terminal (a5) and a sixth inverter (INV6) coupled to the sixth input terminal (a6). Additional details of the input signals INn' and the input bar signals /INn' supplied to the NOR gates (NOR9 to NOR16) will be described below.

The third decoder 34 may include five NOR gates (NOR17 to NOR21). The third decoder 34 may supply input signals INn' and input bar signals /INn' to the NOR gates (NOR17 to NOR21). In an embodiment of the present invention, the input signals INn' may be supplied from a seventh input terminal (a7), an eighth input terminal (a8) and a ninth input terminal (a9), and the input bar signals /INn' may be supplied from a seventh inverter (INV7) coupled to the seventh input terminal (a7), an eighth inverter (INV8) coupled to the eighth input terminal (a8) and a ninth inverter (INV9) coupled to the ninth input terminal (a9). Additional details of the input signals INn' and the input bar signals /INn' supplied to the NOR gates (NOR17 to NOR21) will be described below.

Each of the NAND gates (NAND1 to NAND320) may receive output signals from the first decoder 30, the second decoder 32 and the third decoder 34, and may supply the received output signals to the scan lines (S1 to S320) by performing a NAND operation.

For example, the first NAND gate (NAND 1) may supply scan signals to the first scan line (S1) by performing a NAND operation on outputs of the first NOR gate (NOR1), the ninth NOR gate (NOR9) and the seventeenth NOR gate (NOR17). The second NAND gate (NAND2) may supply scan signals to the second scan line (S2) by performing a NAND operation on outputs of the second NOR gate (NOR2), the ninth NOR gate (NOR9) and the seventeenth NOR gate (NOR17).

Similarly, the sixty-fourth NAND gate (NAND64) may supply scan signals to the sixty-fourth scan line (S64) by performing a NAND operation on outputs of the eighth NOR gate (NOR8), the sixteenth NOR gate (NOR16) and the seventeenth NOR gate (NOR17). The three hundred-twentieth NAND gate (NAND320) may supply scan signals to the three hundred-twentieth scan line (S320) by performing a NAND operation on outputs of the eighth NOR gate (NOR8), the sixteenth NOR gate (NOR16) and the twenty-first NOR gate (NOR21). Thus, each of the NAND gates (NAND1 to NAND320) may supply scan signals to respective ones of the scan lines (S1 to S320) by performing a NAND operation on outputs of the decoders 30, 32, 34. Although not illustrated in FIG. 3, the NAND gates may include an inverter. The input bar signals output from the inverter may be provided to the NAND gates.

Figure 4:
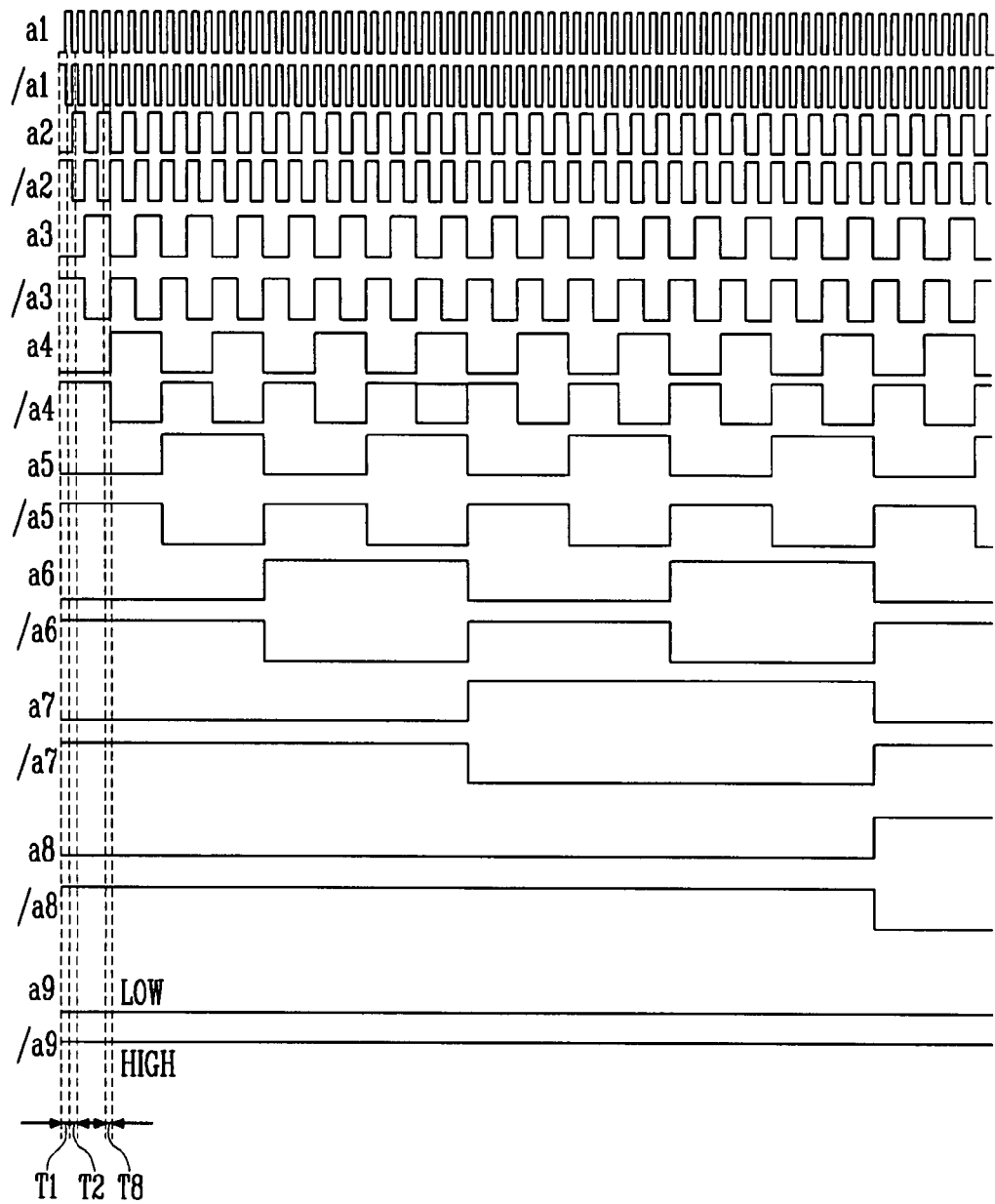
FIG. 4 illustrates driving waveforms according to an embodiment of the present invention.

FIG. 4 illustrates driving waveforms according to an embodiment of the present invention.

Referring to FIG. 4, driving waveforms having different frequencies may be supplied to the input terminals (a1 to a9) of the scan driver illustrated in FIG. 3. In an implementation, the frequencies of the driving waveforms may double with each increment from the ninth input terminal (a9) to first input terminal (a1). For example, the frequency of the driving waveform supplied to the eighth input terminal (a8) may be twice the frequency of the driving waveform supplied to the ninth input terminal (a9), the frequency of the driving waveform supplied to the seventh input terminal (a7) may be twice the frequency of the driving waveform supplied to the eighth input terminal (a8), the frequency of the driving waveform supplied to the sixth input terminal (a6) may be twice the frequency of the driving waveform supplied to the seventh input terminal (a7), etc.

In an implementation (not shown), parasitic capacitance, resistance and signal delays of wiring lines in the scan driver may be reduced using a layout in which the decoders 30, 32, 34 are positioned according to the frequencies of the waveforms applied thereto. For example, the decoder receiving higher frequencies may be positioned nearer the NAND gates (NAND1 to NAND320). Such an arrangement may improve response time.

Figure 5:
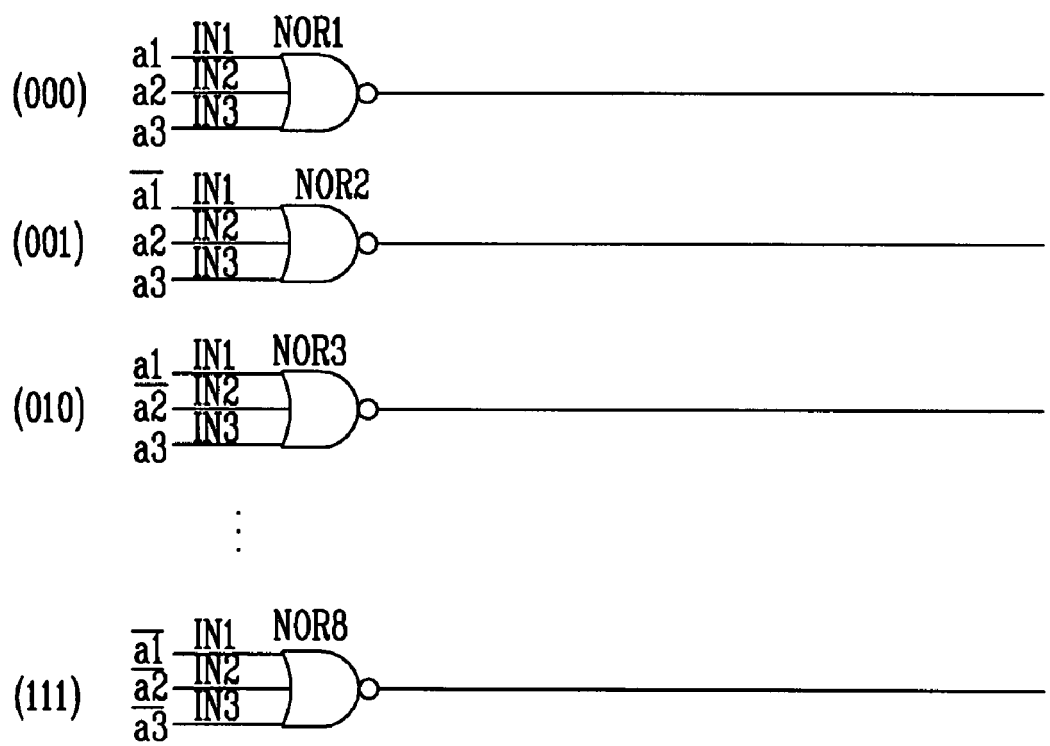
FIG. 5 illustrates a schematic view of NOR gate connections according to an embodiment of the present invention.
Figure 6A:
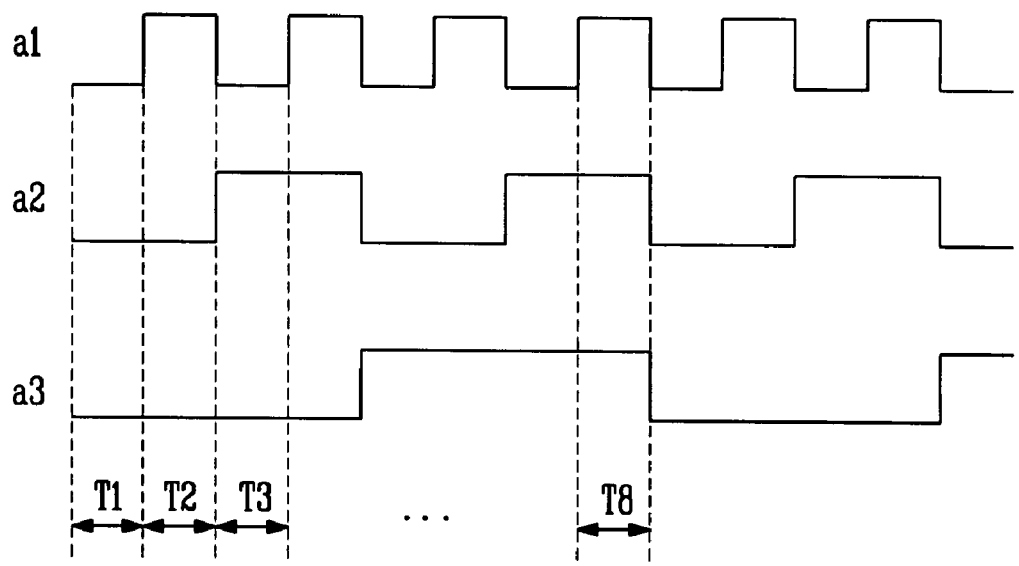
FIG. 6A illustrates a detailed view of driving waveforms according to an embodiment of the present invention.

FIG. 5 illustrates a schematic view of NOR gate connections according to an embodiment of the present invention, and FIG. 6A illustrates a detailed view of driving waveforms according to an embodiment of the present invention. The driving waveforms illustrated in FIG. 6A may be supplied to the first input terminal, the second input terminal, and the third input terminal of the scan driver shown in FIG. 3. For convenience of description, an exemplary connection configuration of the NOR gates (NOR1, NOR2, NOR3 . . . NOR8) included in the first decoder 30 is shown in FIG. 5.

A connection configuration of the NOR gates (NOR9 to NOR21) included in the second decoder 32 and the third decoder 34 may be designed in a similar manner, using different input terminals. For example, the ninth NOR gate (NOR9) may be coupled to the fourth input terminal (a4) through the sixth input terminal (a6) in the same way that the first NOR gate (NOR1) is coupled to the first input terminal (a1) through the third input terminal (a3), as shown in FIG. 5. Similarly, the seventeenth NOR gate (NOR17) may be coupled to the seventh input terminal (a7) through the ninth input terminal (a9).

Referring to FIG. 5, in order for the NAND gates to sequentially output scan signals, the first NOR gate (NOR1) to the eighth NOR gate (NOR8) may sequentially output signals having a HIGH polarity.

The first NOR gate (NOR1) may receive a driving signal from the first input terminal (a1) at the first input signal (IN1'), may receive a driving signal from the second input terminal (a2) at the second input signal (IN2'), and may receive the driving signal from the third input terminal (a3) at the third input signal (IN3). Driving signals supplied from a first input bar terminal (/a1), a second input bar terminal (/a2) and a third input bar terminal (/a3) may be used as the first input bar signal (/IN1'), the second input bar signal (/IN2') and the third input bar signal (/IN3'), respectively.

Referring to FIG. 6A, during the a first period (T1), signals input to the first NOR gate (NOR1) may all have a LOW polarity, and thus the first NOR gate (NOR1) may output a signal having the HIGH polarity during the first period (T1) (see Table 2). Similarly, signals having a LOW polarity may be supplied to the fourth input terminal (a4), the fifth input terminal (a5) and the sixth input terminal (a6) during the first period (T1), such that a signal having a HIGH polarity may be output from a ninth NOR gate (NOR9). Also, signals having a LOW polarity may be supplied to the seventh input terminal (a7), the eighth input terminal (a8) and the ninth input terminal (a9) during the first period (T1), such that a signal having a HIGH polarity may be output from a seventeenth NOR gate (NOR17) during the first period (T1).

The HIGH polarity signals output from the first NOR gate (NOR1), the ninth NOR gate (NOR9) and the seventeenth NOR gate (NOR17) may be supplied to the first NAND gate (NAND1), as shown in FIG. 3. Accordingly, a signal having a LOW polarity, i.e., a scan signal, may be output from the first NAND gate (NAND1) coupled to the first NOR gate (NOR1), the ninth NOR gate (NOR9) and the seventeenth NOR gate (NOR17) (see Table 2). The scan signal may be supplied to the first scan line (S1) during the first period (T1).

The second NOR gate (NOR2) may receive a driving signal from the first input bar terminal (/a1) as the first input signal (IN1'), may receive a driving signal from the second input terminal (a2) as the second input signal (IN2') and may receive the driving signal from the third input terminal (a3) as the third input signal (IN3'). Driving signals supplied from the first input terminal (a1), the second input bar terminal (/a2) and the third input bar terminal (/a3) may be used as the first input bar signal (/IN1), the second input bar signal (/IN2) and the third input bar signal (/IN3), respectively.

During a second period (T2), a signal having a HIGH polarity may be output from the second NOR gate (NOR2), a signal having a HIGH polarity may be output from the ninth NOR gate (NOR9) and a signal having a HIGH polarity may be output from the seventeenth NOR gate (NOR17). The HIGH polarity signals output from the second NOR gate (NOR2), the ninth NOR gate (NOR9) and the seventeenth NOR gate (NOR17) may be provided to the second NAND gate (NAND2), and thus a signal having a LOW polarity, i.e., a scan signal, may be output from the second NAND gate (NAND2). The scan signal may be supplied to the second scan line (S2) during the second period (T2).

The eighth NOR gate (NOR8) may receive a driving signal from the first input bar terminal (/a1) as the first input signal (IN1'), may receive a driving signal from the second input bar terminal (/a2) as the second input signal (IN2'), and may receive a driving signal from the third input bar terminal (/a3) as the third input signal (IN3'). Driving signals supplied from the first input terminal (a1), the second input terminal (a2) and the third input terminal (a3) may be used as the first input bar signal (/IN1), the second input bar signal (/IN2) and the third input bar signal (/IN3), respectively.

During the eighth period (T8), a signal having a HIGH polarity may be output from the eighth NOR gate (NOR8), a signal having a HIGH polarity may be output from the ninth NOR gate (NOR9) and a signal having a HIGH polarity may be output from the seventeenth NOR gate (NOR17). The eighth NOR gate (NOR8), the ninth NOR gate (NOR9) and the seventeenth NOR gate (NOR17) may be coupled to the eighth NAND gate (NAND8), such that a signal having a LOW polarity, i.e., a scan signal, may be output from the eighth NAND gate (NAND8). The scan signal may be supplied to the eighth scan line (S8) during the eighth period (T8).

As described above, a scan driver according to an embodiment of the present invention may sequentially supply a scan signal to scan lines. The scan driver may include NOR gates having transistors that are all a same type of MOS transistor, e.g., all PMOS transistors. The scan driver may also include NAND gates having transistors that are the same type of MOS transistor as the NOR gates, e.g., all PMOS transistors. Thus, a scan driver according to an embodiment of the present invention may be suitable for being formed in a panel of an organic light emitting diode display that includes pixel circuits having PMOS transistors.

An exemplary connection configuration in which the scan signals are sequentially supplied to the scan lines (S1 to S320) has been described above, but embodiments of the present invention are not limited thereto. For example, a scan driver according to another embodiment of the present invention may be configured to drive a display, e.g., an organic light emitting diode display, in a digital mode. In the digital mode, the display may reproduce a predetermined image by supplying a data signal of "1" or "0" and controlling an emission time of each of the pixels. However, contour noise, etc., may be generated where such a digital mode display is driven using subframe units. Therefore, it may be desirable to supply a scan signal to the lines without sequentially supplying the scan signal. It will be appreciated that a scan driver according to an embodiment of the present invention be implemented to supply non-sequential scan signals, and may supply a scan signal to any of the scan lines by changing the driving waveform shown in FIG. 4 and/or the connection configuration shown in FIG. 3.

For example, a non-emission time may be reduced to reduce or eliminate contour noise using an approach in which a scan signal is supplied to the tenth scan line (S10), followed by the sixtieth scan line (S60). The first NAND gate (NAND1) may be coupled to the tenth scan line (S10), and the second NAND gate (NAND2) may be coupled to the sixtieth scan line (S60). Therefore, the scan signal may be supplied to the tenth scan line (S10), then to the sixtieth scan line (S60). Thus, a scan signal may be supplied to a predetermined point by changing connection positions of the NAND gates (NAND1 to NAND320). Accordingly, a scan driver according to an embodiment of the present invention may provide a scan signal suitable for digitally driving a display.

Figure 6B:
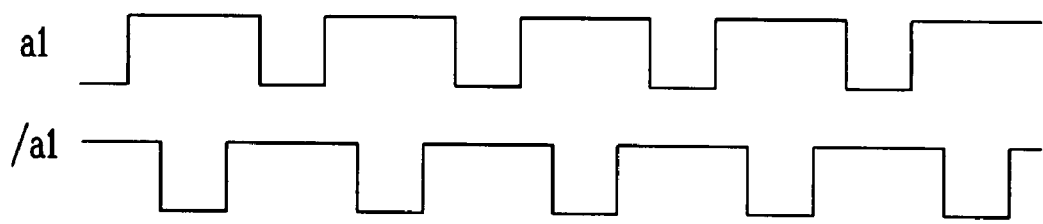
FIG. 6B illustrates driving waveforms according to another embodiment of the present invention.

FIG. 6B illustrates driving waveforms according to another embodiment of the present invention. As shown in FIG. 6B, a period during which the waveform is at a HIGH polarity may be greater than a period during which the waveform is at a LOW polarity. Such a waveform may be used for each of the terminals (a1 to a9, /a1 to /a9) that are illustrated in FIG. 3.

As a particular example, the HIGH polarity may be set to a longer period than that of the LOW polarity in the driving waveform supplied to the first input terminal (a1). Further, the HIGH polarity may be set to a longer period than that of the LOW polarity in the driving waveform supplied to the first input bar terminal (/a1). It will be appreciated that, in this case, the driving waveform supplied to the first input bar terminal (/a1) may not be generated using the above-described inverters, and may instead be externally provided. If the period of the HIGH polarity is set to be longer than that of the LOW polarity in the driving waveform, then the LOW period may be prevented from overlapping with the HIGH polarity due to delay, etc., and therefore a more stable driving arrangement may be provided.

Figure 7:
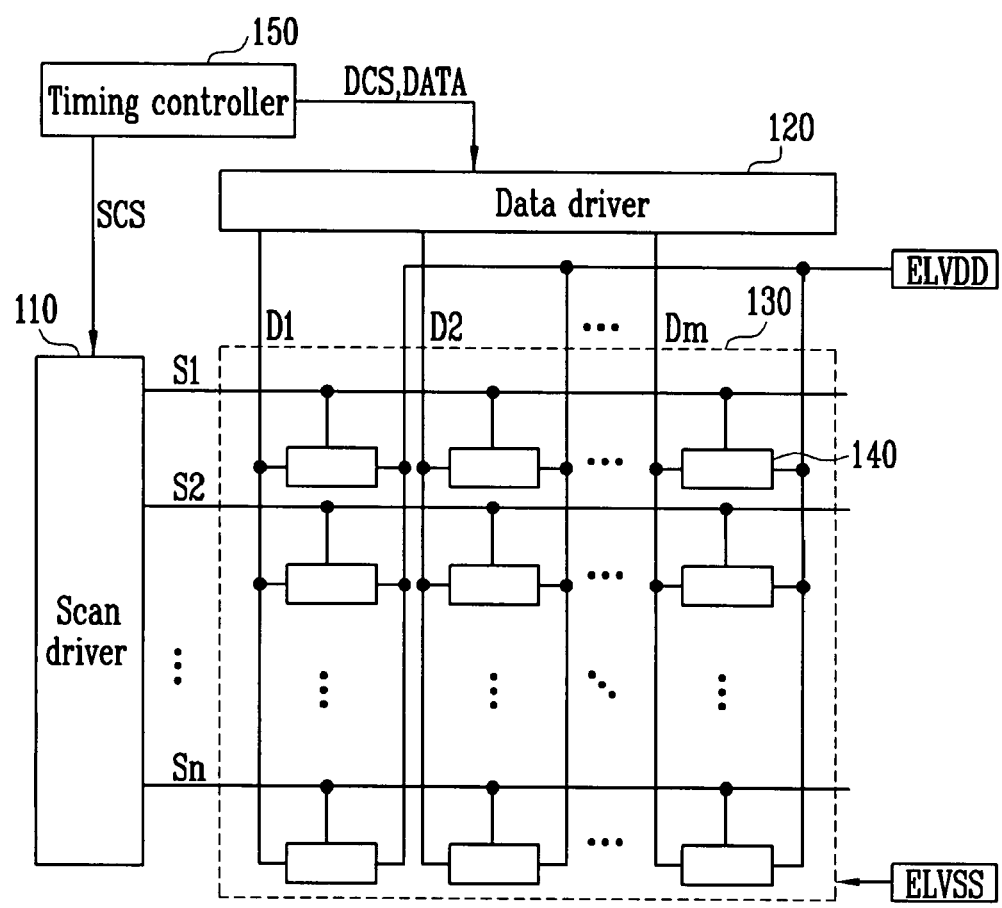
FIG. 7 illustrates a schematic view of an organic light emitting diode display according to an embodiment of the present invention.

FIG. 7 illustrates a schematic view of an organic light emitting diode display according to an embodiment of the present invention.

Referring to FIG. 7, the organic light emitting diode display may include a pixel unit 130 including pixels 140 formed in an intersection region of scan lines (S1 to Sn) and data lines (D1 to Dm); a scan driver 110 for driving the scan lines (S1 to Sn); a data driver 120 for driving the data lines (D1 to Dm); and a timing controller 150 for controlling the scan driver 110 and the data driver 120.

The data driver 120 may generate data signals in response to a data driving control signal (DCS) supplied from a timing controller 150, and may provide the generated data signals to the data lines (D1 to Dm). The data driver 120 may supply the data signals, corresponding to one line, to the data lines (D1 to Dm) in every horizontal period (1H).

The scan driver 110 may generate scan signals in response to a scan driving control signal (SCS) (for example, a signal having waveform similar to a driving waveform shown in FIG. 4) supplied from the timing controller 150, and may supply the generated scan signals to the scan lines (S1 to Sn). The scan signals generated in the scan driver 110 may be sequentially supplied to the scan lines (S1 to Sn), or may be supplied in another order. As described above, the scan driver 110 may include NOR and/or NAND gates having transistors that are all a same type of MOS transistor, and which may be formed in a panel of the display.

In another implementation, in order to reduce a mounting area of a panel, NOR gate decoders 30, 32, 34 for the scan driver 110 may be formed on the data driver 120, e.g., in the form of a chip, or integrated circuit. Thus, the data driver 120 may be formed to include the decoders 30, 32, 34 in the data driver 120 chip. The scan driver 110 may be stably driven by electrically connecting the decoders 30, 32, 34 to NAND gates formed in a panel.

The timing controller 150 may generate a data driving control signal (DCS) and a scan driving control signal (SCS) in correspondence with externally provided synchronizing signals. The data driving control signals (DCS) generated by the timing controller 150 may be supplied to the data driver 120, and the scan driving control signals (SCS) may be supplied to the scan driver 110. The timing controller 150 may rearrange externally provided data and supply the data to the data driver 120.

The pixel unit 130 may receive power from a first driving power source (ELVDD) and a second driving power source (ELVSS), which may be externally provided, and may supply the first driving power source (ELVDD) and the second driving power source (ELVSS) to each of the pixels 140. The pixels 140 may receive the first driving power source (ELVDD) and the second driving power source (ELVSS) in correspondence with a data signal, and may control an electric current flowing from the first driving power source (ELVDD) to the second driving power source (ELVSS) via an organic light emitting diode. Each of the pixels 140 may include one or more transistors. In an embodiment of the present invention, all of the transistors included in the pixels 140 and all of the transistors included in the scan driver 110 may be a same type of MOS transistor, e.g., all PMOS transistors.

As described above, a logic gate according to an embodiment of the present invention may be used for a scan driver in which NOR and NAND logic gate transistors are all PMOS transistors. Thus, the scan driver may be formed in a panel without increasing of the number of masks, since all of the transistors in the scan driver may be a same type as transistors used in pixel circuits, e.g., PMOS transistors. Further, where the scan driver forms part of a display that includes pixel circuits having PMOS transistors, the NOR and NAND gate PMOS transistors may be formed at the same time as the pixel circuit PMOS transistors. Therefore, manufacturing costs may be reduced. A scan driver according to an embodiment of the present invention may be configured to provide a particular order of scan signals to the scan lines by varying the driving waveforms and/or the NOR and NAND gates. Accordingly, the scan driver may be suitable for various driving arrangements.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display, comprising:
    pixel circuits coupled to respective data lines and scan lines;
    a data driver configured to supply data signals to the data lines; and
    a scan driver configured to provide scan signals to the scan lines,
    wherein the scan driver comprises:
        at least one decoder including a plurality of NOR gates, the decoder configured to provide a first plurality of signals; and
        a plurality of NAND gates coupled to respective scan lines, the NAND gates being configured to perform a NAND operation on the first plurality of signals and to provide scan signals to the scan lines,
    wherein all transistors in each of the NOR gates and each of the NAND gates are a same type of MOS transistor.

2. The organic light emitting diode display as claimed in claim 1, wherein:
    the pixel circuits each include at least one transistor, and
    the NAND gates and the pixel circuits are part of a same panel.

3. The scan driver as claimed in claim 2, wherein all the transistors in each of the pixel circuits, each of the NOR gates, and each of the NAND gates are PMOS transistors.

4. The organic light emitting diode display as claimed in claim 1, wherein the NOR gates and the data driver are part of a same chip.

5. The organic light emitting diode display as claimed in claim 1, wherein the at least one decoder includes a plurality of input terminals configured to receive input signals from the outside, and
    a plurality of inverters are coupled respectively to the input terminals to reverse the input signals.

6. The organic light emitting diode display as claimed in claim 1, wherein the at least one decoder includes a plurality of input terminals configured to receive input signals and input bar signals from the outside, the input signals and the input bar signals being set to a longer period of a HIGH polarity than that of a LOW polarity.

7. The organic light emitting diode display as claimed in claim 1, wherein each of the NAND gates comprises:
    a first control transistor configured to control a connection between a second power source and a first output terminal, a first electrode of the first control transistor being coupled to the first output terminal;
    a first plurality of transistors coupled in parallel between the first electrode of the first control transistor and a first power source, the first plurality of transistors being configured to operate in correspondence with the first plurality of signals;
    a second plurality of transistors coupled in parallel between the first electrode of the first control transistor and a gate electrode of the first control transistor, the second plurality of transistors being configured to operate in correspondence with the first plurality of signals; and
    a third plurality of transistors coupled in series between the second power source and the gate electrode of the first control transistor, the third plurality of transistors being configured to operate in correspondence with a first plurality of bar signals.

8. The organic light emitting diode display as claimed in claim 7, wherein each of the NOR gates comprises:
    a second control transistor configured to control a connection between a fourth power source and a second output terminal, a first electrode of the second control transistor being coupled to the second output terminal;
    a fourth plurality of transistors coupled in series between the first electrode of the second control transistor and a third power source, the fourth plurality of transistors being configured to operate in correspondence with a plurality of input signals;
    a fifth plurality of transistors coupled in series between the first electrode of the second control transistor and a gate electrode of the second control transistor, the fifth plurality of transistors being configured to operate in correspondence with the plurality of input signals; and a sixth plurality of transistors coupled in parallel between the gate electrode of the second control transistor and the fourth power source, the sixth plurality of transistors being configured to operate in correspondence with a plurality of input bar signals.

9. The organic light emitting diode display as claimed in claim 8, wherein the first and third power sources provide a same first voltage, and the second and fourth power sources provide a same second voltage that is lower than the first voltage.

10. The organic light emitting diode display as claimed in claim 1, wherein each of the NOR gates comprises:
  a control transistor configured to control a connection between a second power source and an output terminal, a first electrode of the control transistor being coupled to the output terminal;
  a first plurality of transistors coupled in series between the first electrode of the control transistor and a first power source, the first plurality of transistors being configured to operate in correspondence with a plurality of input signals;
  a second plurality of transistors coupled in series between the first electrode of the control transistor and a gate electrode of the control transistor, the second plurality of transistors being configured to operate in correspondence with the plurality of input signals; and
  a third plurality of transistors coupled in parallel between the gate electrode of the control transistor and the second power source, the third plurality of transistors being configured to operate in correspondence with a plurality of input bar signals.

11. The organic light emitting diode display as claimed in claim 1, wherein:
  the display includes a plurality of decoders,
  the display is configured to provide a plurality of input signals to the decoders, the input signals having different frequencies, and
  a decoder receiving a higher frequency input signal is disposed closer to the NAND gates than a decoder receiving a lower frequency input signal.

12. A scan driver, comprising:
  at least one decoder including a plurality of NOR gates, the decoder configured to provide a first plurality of signals; and
  a plurality of NAND gates configured to perform a NAND operation on the first plurality of signals and to provide scan signals,
  wherein all transistors in each of the NOR gates and each of the NAND gates are a same type of MOS transistor.

13. The scan driver as claimed in claim 12, wherein all the transistors in each of the NOR gates and each of the NAND gates are PMOS transistors.

14. The scan driver as claimed in claim 12, wherein the at least one decoder includes a plurality of input terminals configured to receive input signals from the outside, and
  a plurality of inverters are coupled respectively to the input terminals to reverse the input signals.

15. The scan driver as claimed in claim 12, wherein the at least one decoder includes a plurality of input terminals configured to receive input signals and input bar signals from the outside, the input signals and the input bar signals being set to a longer period of a HIGH polarity than that of a LOW polarity.

16. The scan driver as claimed in claim 12, wherein each of the NAND gates comprises:
  a first control transistor configured to control a connection between a second power source and a first output terminal, a first electrode of the first control transistor being coupled to the first output terminal;
  a first plurality of transistors coupled in parallel between the first electrode of the first control transistor and a first power source, the first plurality of transistors being configured to operate in correspondence with the first plurality of signals;
  a second plurality of transistors coupled in parallel between the first electrode of the first control transistor and a gate electrode of the first control transistor, the second plurality of transistors being configured to operate in correspondence with the first plurality of signals; and
  a third plurality of transistors coupled in series between the second power source and the gate electrode of the first control transistor, the third plurality of transistors being configured to operate in correspondence with a first plurality of bar signals.

17. The scan driver as claimed in claim 16, further comprising a capacitor coupled between the first electrode and the gate electrode of the first control transistor.

18. The scan driver as claimed in claim 16, wherein each of the NOR gates comprises:
  a second control transistor configured to control a connection between a fourth power source and a second output terminal, a first electrode of the second control transistor being coupled to the second output terminal;
  a fourth plurality of transistors coupled in series between the first electrode of the second control transistor and a third power source, the fourth plurality of transistors being configured to operate in correspondence with a plurality of input signals;
  a fifth plurality of transistors coupled in series between the first electrode of the second control transistor and a gate electrode of the second control transistor, the fifth plurality of transistors being configured to operate in correspondence with the plurality of input signals; and
  a sixth plurality of transistors coupled in parallel between the gate electrode of the second control transistor and the fourth power source, the sixth plurality of transistors being configured to operate in correspondence with a plurality of input bar signals.

19. The scan driver as claimed in claim 18, further comprising a second capacitor coupled between the first electrode and the gate electrode of the second control transistor.

20. The scan driver as claimed in claim 12, wherein each of the NOR gates comprises:
  a control transistor configured to control a connection between a second power source and an output terminal, a first electrode of the control transistor being coupled to the output terminal;
  a first plurality of transistors coupled in series between the first electrode of the control transistor and a first power source, the first plurality of transistors being configured to operate in correspondence with a plurality of input signals;
  a second plurality of transistors coupled in series between the first electrode of the control transistor and a gate electrode of the control transistor, the second plurality of transistors being configured to operate in correspondence with the plurality of input signals; and
  a third plurality of transistors coupled in parallel between the gate electrode of the control transistor and the second power source, the third plurality of transistors being configured to operate in correspondence with a plurality of input bar signals.

21. A NAND gate, comprising:
- a control transistor configured to control a connection between a second power source and an output terminal, a first electrode of the control transistor being coupled to the output terminal;
- a first plurality of transistors coupled in parallel between the first electrode of the control transistor and a first power source, the first plurality of transistors being configured to operate in correspondence with a plurality of signals;
- a second plurality of transistors coupled in parallel between the first electrode of the control transistor and a gate electrode of the control transistor, the second plurality of transistors being configured to operate in correspondence with the plurality of signals; and
- a third plurality of transistors coupled in series between the second power source and the gate electrode of the control transistor, the third plurality of transistors being configured to operate in correspondence with a plurality of bar signals.

22. The NAND gate as claimed in claim 21, further comprising a capacitor coupled between the first electrode and the gate electrode of the control transistor.

23. A NOR gate, comprising:
- a control transistor configured to control a connection between a second power source and an output terminal, a first electrode of the control transistor being coupled to the output terminal;
- a first plurality of transistors coupled in series between the first electrode of the control transistor and a first power source, the first plurality of transistors being configured to operate in correspondence with a plurality of input signals;
- a second plurality of transistors coupled in series between the first electrode of the control transistor and a gate electrode of the control transistor, the second plurality of transistors being configured to operate in correspondence with the plurality of input signals; and
- a third plurality of transistors coupled in parallel between the gate electrode of the control transistor and the second power source, the third plurality of transistors being configured to operate in correspondence with a plurality of input bar signals.

24. The NOR gate as claimed in claim 23, further comprising a capacitor coupled between the first electrode and the gate electrode of the control transistor.

* * * * *